(12) United States Patent
Macomber

(10) Patent No.: US 6,455,341 B1
(45) Date of Patent: Sep. 24, 2002

(54) INCREASING THE YIELD OF PRECISE WAVELENGTH LASERS

(75) Inventor: Steven Henry Macomber, Tucson, AZ (US)

(73) Assignee: OPTO Power Corporation, Tucson, AZ (US)

( * ) Notice: Subject to any disclaimer, the term of this patent is extended or adjusted under 35 U.S.C. 154(b) by 0 days.

(21) Appl. No.: 09/848,529

(22) Filed: May 3, 2001

(51) Int. Cl.[7] .............................................. H01L 21/00
(52) U.S. Cl. .............................. 438/32; 438/47; 372/47
(58) Field of Search ......................... 438/32, 47; 372/47

(56) References Cited

U.S. PATENT DOCUMENTS

| | | |
|---|---|---|
| 4,704,720 A | 11/1977 | Yamaguchi |
| 4,178,604 A | 11/1979 | Nakamura |
| 5,373,517 A * | 12/1994 | Dragone et al. ............... 372/20 |
| 5,396,507 A * | 3/1995 | Kaminow et al. .......... 372/108 |
| 5,444,725 A * | 8/1995 | Zirngibl ........................ 372/20 |
| 5,675,592 A * | 10/1997 | Dragone et al. ............... 372/20 |
| 5,745,511 A * | 4/1998 | Leger .......................... 372/102 |
| 5,881,079 A * | 3/1999 | Doerr et al. ................. 372/102 |
| 6,138,572 A * | 10/2000 | Ruggles ....................... 102/213 |

OTHER PUBLICATIONS

Electronics Letters Jan. 7, 1982, vol. 18, No. 1, "CW Operation of DFB–BH GaInAsP/InP Lasers in 1.5 μm Wavelength Region".

* cited by examiner

Primary Examiner—Olik Chaudhuri
Assistant Examiner—William C Vesperman
(74) Attorney, Agent, or Firm—Howard R. Popper

(57) ABSTRACT

A wafer supporting a semiconductor structure having a material gain function that would preferentially support an F-P laser mode at an unwanted wavelength $\lambda 2$ is provided with a second order dielectric grating located sufficiently remotely from the high intensity optical field of the quantum well and the waveguide to receive just enough transverse mode energy to provide feedback to reduce the gain at $\lambda 2$ and support oscillation at a desired wavelength $\lambda 1$. More particularly, by providing a gain discrimination factor $\alpha \approx 0.1$ cm$^{-1}$, the fraction of power lost to transverse mode radiation can be held to about 1% which is sufficient to provide stabilizing feedback without sapping too much energy from the longitudinal beam.

5 Claims, 2 Drawing Sheets

INCREASING THE YIELD OF PRECISE WAVELENGTH LASERS

FIELD OF THE INVENTION

This invention relates to longitudinal mode laser diodes and, more particularly, to achieving higher yields of devises lasing at a desired wavelength.

BACKGROUND OF THE PRIOR ART

Existing semiconductor laser fabrication processes have difficulty in achieving devices that oscillate at a precise wavelength. One of the contributing factors is a variation of the material gain function that may arise during epitaxial crystal growth. Typical variation in lasing wavelength of lasers made from different growths may amount to +/−4 nm. However many applications require lasers to have a wavelength accuracy of +/−1 nm or better, e.g., for the optical pumping of Nd:YAG lasers at 808 nm. Other factors such as stress, temperature and thermal non-uniformities often cause additional variable shifts. The mismatch between the achievable wavelength variation and end-user specifications has led to difficulties in achieving desirable manufacturing yields.

The most common type of laser diode structure is the double heterostructure which uses a ternary or quaternary material such as AlGaAs or GaInAsP in which a narrow bandgap, optically active, thin layer (0.1–0.2 μm thick) is sandwiched between a pair of thicker, wider-bandgap cladding layers. A semiconductor, edge-emitting (longitudinal mode) diode laser typically includes a resonator formed of a solid state laser gain medium extending longitudinally between input and output mirror surfaces usually formed by cleaving. The distance between the facets defines a Fabry-Perot cavity which is capable of sustaining several different longitudinal lasing modes. The gain medium is typically enclosed on laterally adjacent sides by reflective material having an index of refraction $n_2$ which is greater than the index of refraction $n_1$ of the gain medium material.

To improve wavelength stability, feedback can be provided by locating a first or second order grating of suitable pitch either internally to the gain region of the solid state structure (for the DFB laser), or externally thereto (for the DBR laser). For example, U.S. Pat. No. 4,178,604 issued Dec. 11, 1979 shows a laser diode operating at 0.875 μm stabilized by a first order grating having a pitch $\Lambda=0.123$ μm and an index of refraction n≅3.55 located between the active layer (n=3.6) and another layer (n=3.36). The grating is formed by using ultraviolet light to photolithographically etching a semiconductor layer located 0.3 μm away from the 0.1 μm thick active layer and having a refractive index lower than that of the active layer using interfering ultra-violet beams. The grating can be termed a "first order" grating since the pitch $\Lambda=0.123$ μm is related to the desired laser wavelength $\lambda=0.875$ μm by $\Lambda=\lambda/2n$. Unfortunately, ultra-violet light photolithography requires extensive measure to prevent unwanted carbon coating of optics due to photolyzation of organic material which generally dictates that the process be performed in an extensively purged environment. Moreover, the surface of the mirror used to reflect the interfering waves must be extremely smooth to avoid unwanted scattering that would detract from the precise exposure of the photoresist, scattering being proportional to the inverse-fourth power of the wavelength of light employed. Finally, UV lasers are notoriously unreliable. It would be extremely desirable to avoid the use of ultraviolet light in the manufacturing process.

Another example of a DFB laser appears in vol. 18 Electronics Letters for Jan. 7, 1982, at pp. 27, 28 which shows a GaInAsP/InP laser operating at a wavelength of 1.5 μm using a second order grating ($\Lambda=0.4522\mu$) etched into an n-InP substrate. The grating was buried in a heterostructure comprised of a 0.17 μm thick waveguide layer of Sn-doped, n-GaInAsP adjacent to a non-doped, 0.19 μm thick GaInAsP active layer. To suppress unwanted Fabry-Perot, modes the rear facet of the cavity was inclined.

U.S. Pat. No. 4,704,720 issued No. 3, 1987 asserted that the grating used in the aforementioned laser was located too far away from (i.e, too weakly coupled to) the optical field so that, at certain values of the injected current, oscillation at the unwanted Fabry Perot modes occurred instead of at the desired single wavelength. Accordingly, the '720 patent laser, operating at an exemplary wavelength of 1.3 μm, located its second order grating (having a pitch of $\Lambda=0.4\mu$) in the strongest part of the optical field to obtain oscillation in a single longitudinal mode. Alternatively, a first order grating having a finer pitch ($\Lambda=0.2\mu$) was suggested.

While a second order grating can be produced using lower energy blue light beams in the photolithographic process, second order gratings located in the high intensity optical field of the active layer or of the waveguide layer give rise to diffraction orders that sap energy from the single desired longitudinal mode. It would, however, facilitate ease of manufacture if blue light beams could be used to produce second order gratings on wafers made from production runs of crystal growths having reasonable variation in their material gain function without incurring the penalty of exciting transverse modes that sap energy from the longitudinal beam, and especially at a wavelength of 0.808 μm required to drive erbium doped fiber systems.

SUMMARY OF THE INVENTION

In accordance with the principles of the present invention, in one illustrative embodiment thereof, a wafer having a material gain function that would preferentially support an F-P laser mode at an unwanted wavelength $\lambda 2$ is provided with a second order dielectric grating located sufficiently remotely from the high intensity optical field to receive just enough transverse mode energy to provide feedback to reduce the gain at $\lambda 2$ and support oscillation at a desired wavelength $\lambda 1$. More particularly, it has been discovered that by providing a gain discrimination factor with order of magnitude $\alpha \approx 0.1$ cm$^{-1}$, the fraction of power lost to transverse mode radiation can be held to less than 1 percent which is sufficient to provide stabilizing feedback without sapping too much energy from the longitudinal beam. The grating, defined by effecting a corrugated interface between two layers in the epitaxial growth structure which are grown with slightly different indices of refraction, extends over the entire surface of the wafer. When the material is processed into Fabry-Perot laser devices, the coated facets provide most of the feedback while the grating alters the Fabry-Perot longitudinal mode spectrum to create a preferred resonance condition.

GENERAL DESCRIPTION

Figure 1:
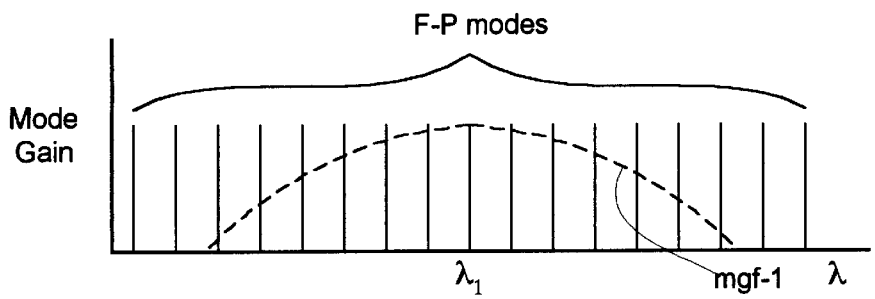
FIG. 1 shows the material gain function of a wafer that will preferentially support an F-P oscillation mode at a desired wavelength $\lambda 1$.
Figure 2:
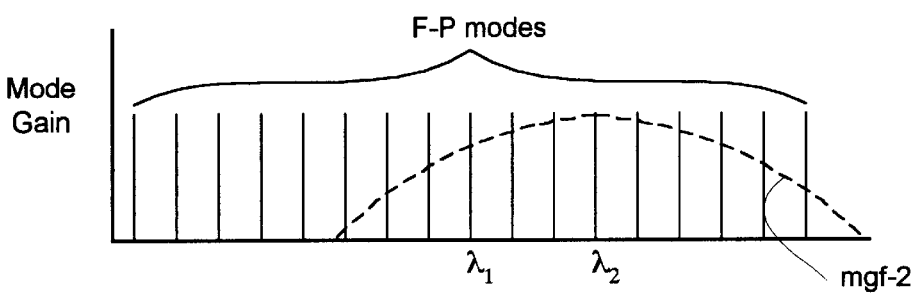
FIG. 2 shows the material gain function of a wafer that will preferentially support an F-P oscillation mode at an undesired wavelength $\lambda 2$.

Material gain function is a plot of the mode gain per cm of material at each of the different modal wavelengths capable of being sustained in an F-P cavity laser. Each of the modes requires substantially the same gain to support oscillation. More particularly, when a laser diode first starts oscillating after receiving a current pulse, it may initially generate several orders of resonant lines, with the order nearest the peak of the material gain becoming dominant. Normally, lasing will occur at the wavelength corresponding to the peak of the material gain function. This central order will then remove energy from the side orders, provided the diode is so designed and, finally, the central line will become increasingly narrower although with some drift. FIG. 1 shows that as the drive current provided to a semiconductor cavity structure built on a wafer having the desired material gain function is increased, the material gain function mgf-1 rises until its peak intersects the gain required to sustain oscillation at wavelength $\lambda 1$ among the variety of possible F-P modes. Unfortunately, the yield of wafers that can be cut from a crystal having the exact material gain function peak wavelength mgf-1 may, in practice, be quite low. A typical wafer, for example, may have a material gain function mgf-2, shown in FIG. 2 that would, when incorporated in a semiconductor structure similar to that used for FIG. 1, naturally sustain oscillation at the undesired wavelength $\lambda 2$. Such a wafer would not be usable for the purpose intended.

Figure 4:
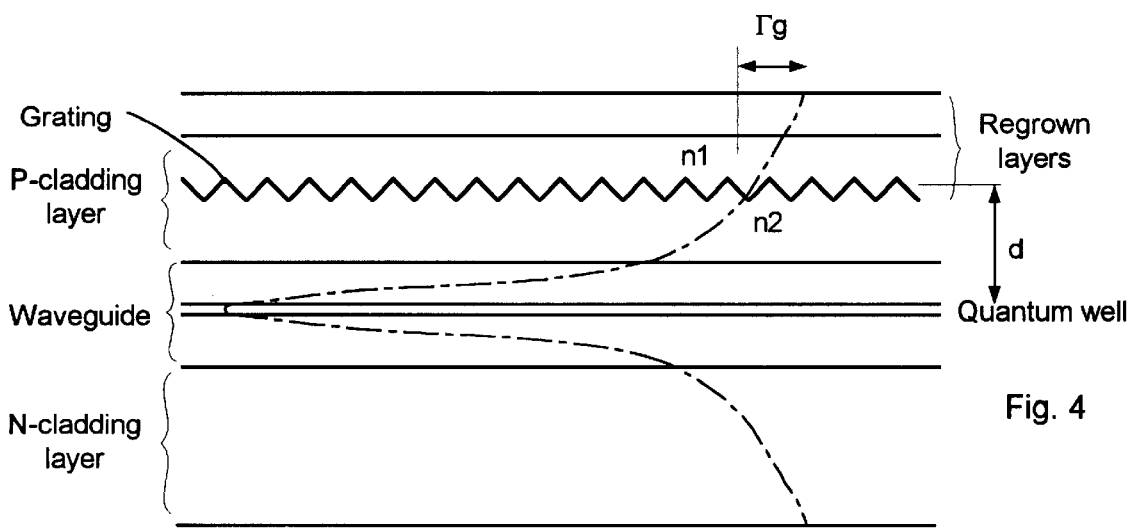
FIG. 4 shows a semiconductor structure built on a wafer having the material gain function of FIG. 2 including a grating located where the field strength is sufficient to provide a gain discrimination factor $\alpha \approx 0.1$ cm$^{-1}$ at the desired wavelength of $\lambda 1$.

In accordance with the invention, as shown in FIG. 4, a semiconductor structure can be achieved that will support oscillation at wavelength $\lambda 1$ using a structure can be built on a wafer that would exhibit the previously undesirable material gain function mgf-2. The quantum well and waveguide layers are formed on the wafer in the usual way. However, a second order grating is etched onto a layer having an index of refraction n1 and covered with a regrown layer having an index of refraction n2 and a re-grown cladding layer. The second order grating is etched into layer n2 at a location where the field strength, $\Gamma_g$, is much lower than the field strength that will be present in the quantum well and waveguide areas in the energized laser.

The periodicity of the second order grating chosen to achieve the illustrative operating wavelength $\lambda$=808 nm dictates a pitch $\Lambda/n \approx 240$ nm. When the second order grating provides a gain discrimination factor $\alpha \approx 0.1$ cm$^{-1}$, the fraction of power lost to radiation can be estimated from $(1-e^{\alpha L})$ $\approx 0.02$ or 2%, where L$\approx$2 mm is the cavity length. Using a more sophisticated numerical model, it has been determined that the radiation power loss is actually much less than one percent due to optical interference in the diffraction radiation between the counter-propagating waves within the guide. Thus, a second-order grating with $\alpha \approx 0.1$ cm$^{-1}$ does not cause a significant radiation loss and could be more easily manufactured than a first order grating. The question is whether a grating located to have a gain discrimination factor $\alpha \approx 0.1$ cm$^{-1}$ would provide sufficiently strong feedback to help stabilize the laser wavelength.

With the grating located as in FIG. 4, it provides feedback to reduce the gain required to sustain oscillation at $\lambda 1$. As the current drive increases in FIG. 3, the material gain function curve mgf-2 rises and intersects the gain for oscillation at $\lambda 1$ before it intersects the gain required to sustain oscillation at $\lambda 2$. The F-P mode requiring lowest gain will be the first to start lasing and, once established, will preempt lasing at other modes (i.e., the gain curve stops rising once threshold is achieved). Accordingly, the mode at wavelength $\lambda_1$ will take over and predominate, having pulled it over a distance $\delta$, illustratively +/-4 nm.

Figure 3:
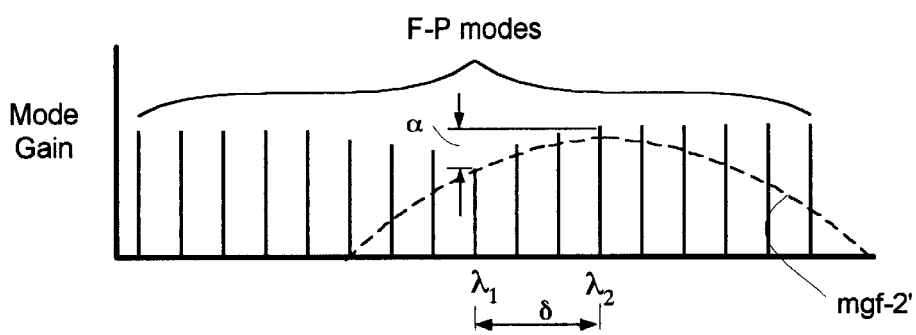
FIG. 3 shows the wavelength pulling effect δ of a second order grating which reduces the gain at $\lambda 2$ by α to preferentially support an F-P oscillation at a wavelength of $\lambda 1$.

If the condition shown in FIG. 3 is to be achieved using a second order grating to provide the wavelength stabilizing feedback, it is important not to feedback too much power as this will give rise to unwanted radiation loss. First, define $\Gamma_g$ as the fraction of the optic field intensity that is present at the location of the grating. Next, consider each grating groove as if it were a weak mirror. If the grating lies between layers having indices of refraction n1 and n2, the reflectivity, R, at each groove is given by:

$$R = \left|\frac{n_1 - n_2}{n_1 + n_2}\right|^2 \approx \left|\frac{\Delta n}{2n}\right|^2 \tag{1}$$

The gain discrimination factor $\alpha$ which is the fraction of reflected optic field per groove $\Lambda$ (measured in inverse centimeters, cm$^{-1}$), is estimated from:

$$\alpha = \frac{\Gamma_g R}{\Lambda} = \frac{\Gamma_g \left|\frac{\Delta n}{2n}\right|^2}{\Lambda} \tag{2}$$

Illustratively, let it be assumed that $\alpha$=0.1 cm$^{-1}$, and let us calculate the value of $\Gamma_g$ using typical values for $\Delta n$=0.05, and n$\approx$3.3. From equation (1), it turns out that R=5.7$\times 10^{-5}$. Rearranging the terms in equation (2) yields:

$$\Gamma_g = \frac{\alpha \Lambda}{R} = \frac{0.1 \times 0.2 \times 10^{-4}}{5.75 \times 10^{-5}} = 0.035.$$

Thus, by controlling the distance d from the quantum well and waveguide layers to get the appropriate field strength $\Gamma_g$, the difference $\Delta n$ in indices of refraction of layers n1 and n2, and the depth of the grating, the appropriate gain discrimination factor is determined.

Nominal Fabrication Process

The epitaxial structure is grown (usually by MBE or MOCVD method) up to the position of the grating layer. After removal from the growth system, photoresist is spun onto the wafer surface and baked. The wafer is mounted onto a vacuum holder that is rotatable with respect to the incident collimated beam. If a suitable optical reference is used in conjunction with a precision rotation stage, the absolute precision of the grating wavelength is on the order of a one angstrom. The use of 457 nm exposure wavelength enables this exposure geometry without use of a UV laser. The entire exposure system can be very compact if a frequency-doubled Nd vanadate laser is used. Alternately, the 457.8 nm line of argon-ion lasers will work just as well. The grating is thus exposed over the whole wafer surface. No cleaving nor masking steps are needed. The photoresist is developed and the grating is transferred into the p-surface by reactive ion etching followed by some wet chemical etching to clean up any ion damage. The wafer is then placed back into the crystal growth reactor for growth (re-growth) of the final layers. This design may be best achieved by use of aluminum free materials for the grating layers such as InGaAsP that is lattice matched to GaAs. This would avoid problems with regrowth on oxidized AlGaAs material.

Figure 5:
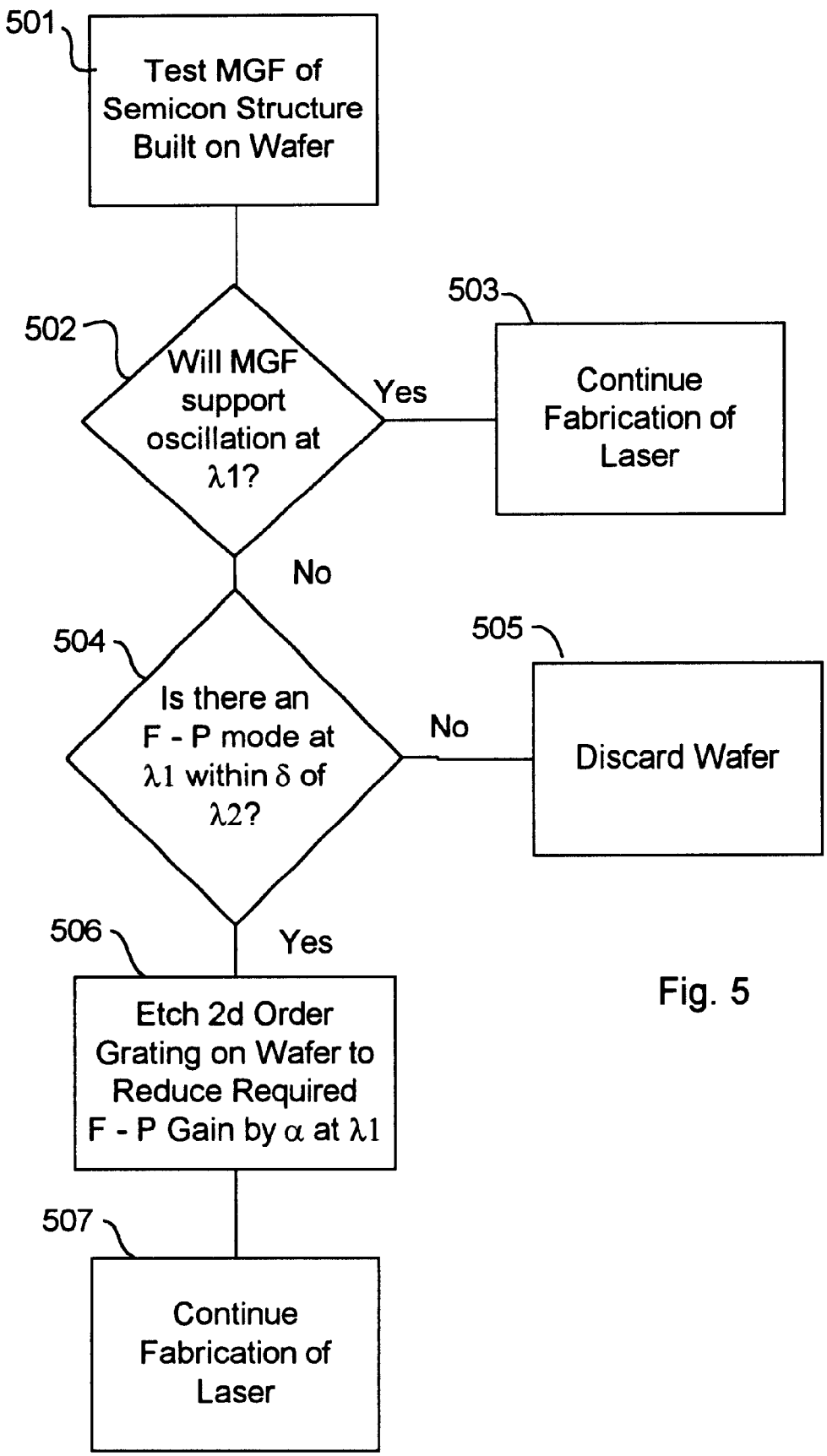
FIG. 5 shows the process of using a second order grating to convert a semiconductor structure having a material gain functions that supports oscillation at $\lambda 2$ into a structure that will sustain oscillation at the desired F-P mode of $\lambda 1$.

FIG. 5 shows the process of using a second order grating to convert a layered structure into a structure that will sustain the desired F-P mode. Beginning with step 501, ascertain the material gain function of the structure. In practice photoluminescence can be used to estimate whether or not the gain peak is close enough to the target wavelength for the grating to "pull" it over. If the structure has an mgf that will sustain oscillation at $\lambda 1$, normal fabricating processes continue at 503. If the mgf is such as to support oscillation the process proceeds to steps 502 and 503 to determine if there exists an F-P mode at the desired wavelength 11. If there is such an F-P mode, a second order grating is etched into a layer having an index of refraction of n1 at step 506. This layer is sufficiently remotely from the quantum well and waveguide layers to provide enough feedback to reduce the F-P gain required at $\lambda 1$ for oscillation at that wavelength. Then at step 507 at least one layer having an index of refraction of n2 is regrown during normal fabrication. Of course the wafer need not necessarily be "discarded" at step 505 since some use may be appropriate.

The foregoing describes an illustrative embodiment of the invention. Further and other modifications may be made by those skilled in the art without, however, departing from the spirit and scope of the invention.

What is claimed is:

1. A method of increasing the yield of semiconductor laser devices comprising the steps of:
    a. forming a layered structure on a wafer exhibiting a material gain function capable of sustaining oscillation at a number of F-P modes, said material gain function normally giving rise to oscillation at a wavelength of $\lambda 2$;
    b. etching a second order grating on one of the layers of said structure where the field strength is sufficient to provide feedback gain discrimination factor of 0.1 cm$^{-1}$ at a wavelength of $\lambda 1$.

2. A method of increasing the yield of semiconductor laser devices giving rise to oscillation at a wavelength of $\lambda 1$, comprising the steps of:
    a. forming a layered structure including a quantum well and waveguide layers on a wafer exhibiting a material gain function capable of sustaining oscillation at a number of F-P modes, said material gain function normally giving rise to oscillation at a wavelength of $\lambda 2$;
    b. creating a second order grating between layers having a difference of refractive indices; said grating being positioned where the field strength is less than one ten-thousandth of the field strength of the quantum well and waveguide layers, said grating providing a feedback gain discrimination factor of $\alpha$ between wavelengths of $\lambda 2$ and $\lambda 1$.

3. A method of increasing the yield of semiconductor laser devices according to claim 2 wherein $\alpha$ has a value not greater than which is sufficient to pull the wavelength over a range of approximately +/−4 nm.

4. A method of increasing the yield of semiconductor laser devices comprising the steps of:
    a. forming on a wafer a layered structure including a quantum well and waveguide layers exhibiting a material gain function capable of sustaining oscillation at a number of F-P modes, said structure having a material gain function normally giving rise to oscillation at a wavelength of $\lambda 2$;
    b. photolithographically etching one of said layers with blue light to produce a second order grating thereon; said one of said layers being remotely located from said quantum well and waveguide layers;
    c. regrowing on said one of said layers at least one layer having a different index of refraction from said one of said layers;
    d. said grating providing a feedback gain discrimination factor of $\alpha$ between wavelengths of $\lambda 2$ and $\lambda 1$.

5. A method of increasing the yield of semiconductor laser devices according to claim 4 wherein said gain discrimination factor is at least 0.1 cm$^{-1}$.

* * * * *